(12) United States Patent
Brannen

(10) Patent No.: US 8,004,337 B2
(45) Date of Patent: Aug. 23, 2011

(54) DIGITAL DELAY CIRCUIT

(75) Inventor: Robert Alan Brannen, Chandler, AZ (US)

(73) Assignee: Dolpan Audio, LLC, Dover, DE (US)

( * ) Notice: Subject to any disclaimer, the term of this patent is extended or adjusted under 35 U.S.C. 154(b) by 26 days.

(21) Appl. No.: 11/700,731

(22) Filed: Jan. 30, 2007

(65) Prior Publication Data

US 2008/0180154 A1 Jul. 31, 2008

(51) Int. Cl.
*H03H 11/26* (2006.01)
(52) U.S. Cl. ......................... 327/264; 327/281
(58) Field of Classification Search .................. None
See application file for complete search history.

(56) References Cited

U.S. PATENT DOCUMENTS

| | | | | |
|---|---|---|---|---|
| 5,808,505 A * | 9/1998 | Tsukada | | 327/536 |
| 6,054,888 A * | 4/2000 | Maley | | 327/333 |
| 6,191,630 B1 * | 2/2001 | Ozawa et al. | | 327/278 |
| 6,310,505 B1 * | 10/2001 | Ogawa et al. | | 327/276 |
| 6,556,088 B1 * | 4/2003 | Dietl et al. | | 331/17 |
| 6,677,825 B2 * | 1/2004 | Kozaki | | 331/57 |
| 7,180,342 B1 * | 2/2007 | Shutt et al. | | 327/122 |
| 7,227,386 B2 * | 6/2007 | Chen | | 327/12 |
| 7,230,467 B1 * | 6/2007 | Gan et al. | | 327/261 |
| 7,382,117 B2 * | 6/2008 | Suda et al. | | 324/158.1 |
| 7,557,631 B2 * | 7/2009 | Sinha et al. | | 327/261 |
| 7,619,457 B1 * | 11/2009 | Mai | | 327/276 |
| 2001/0045856 A1 * | 11/2001 | Ooishi | | 327/277 |
| 2002/0093370 A1 * | 7/2002 | Park et al. | | 327/262 |
| 2009/0146718 A1 * | 6/2009 | Chen | | 327/288 |

\* cited by examiner

*Primary Examiner* — Lincoln Donovan
*Assistant Examiner* — Sibin Chen
(74) *Attorney, Agent, or Firm* — Knobbe Martens Olson & Bear LLP

(57) ABSTRACT

A digital time delay circuit is provided in which fabrication process variations and temperature effects on the switching threshold level of digital circuits utilized in the timing delay circuits are substantially eliminated.

16 Claims, 3 Drawing Sheets

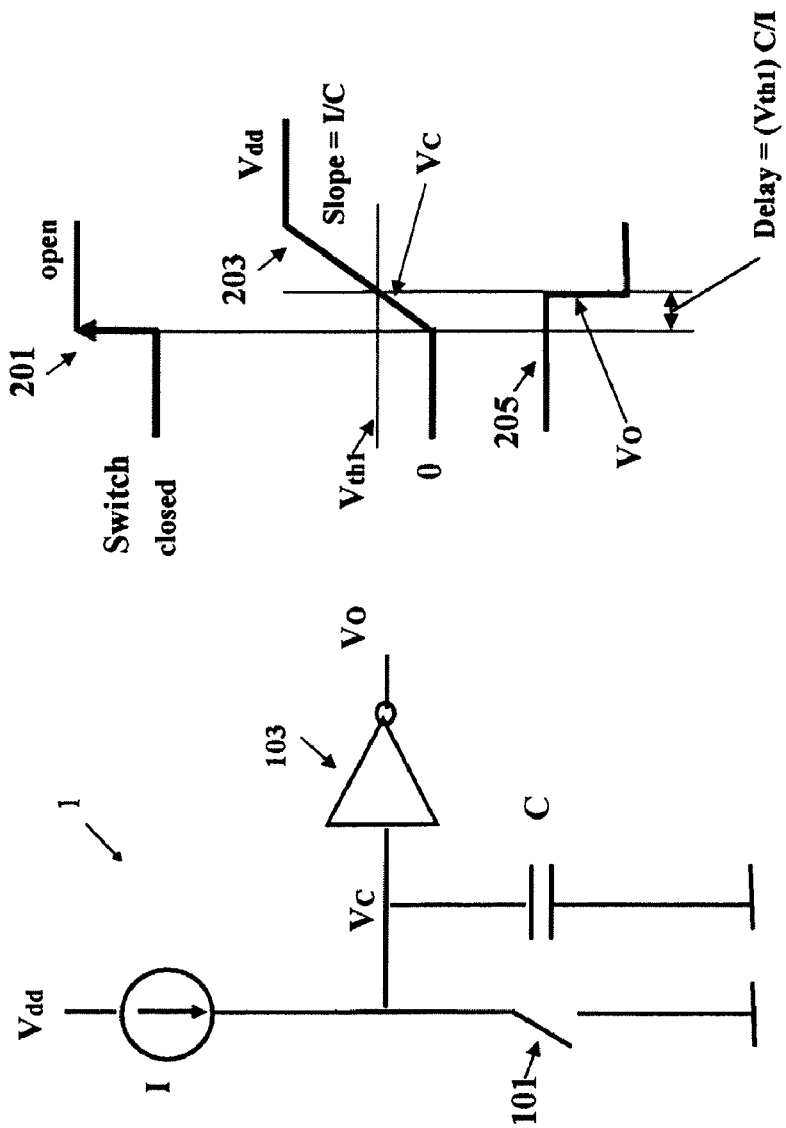
(Prior Art)
FIG. 2
(Prior Art)
FIG. 1

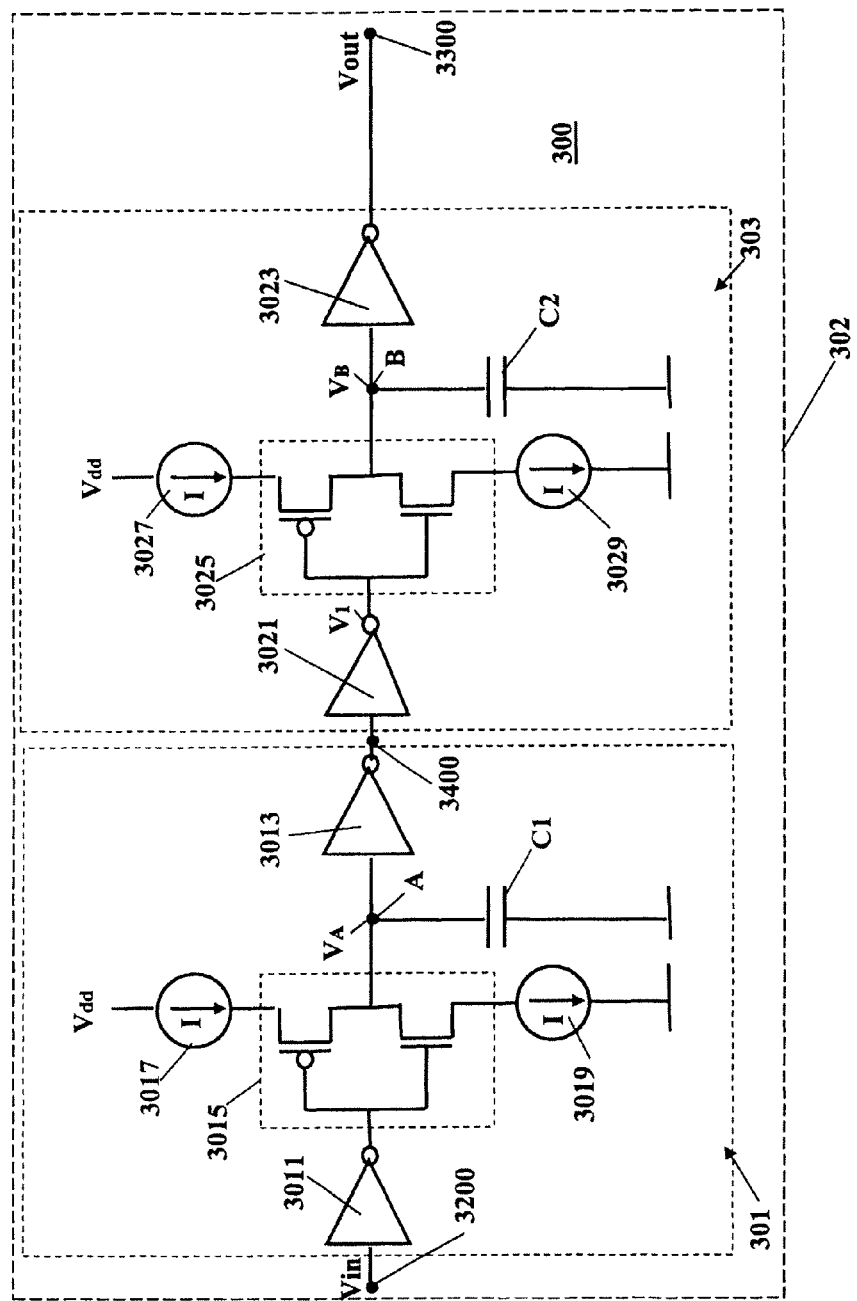
FIG. 3

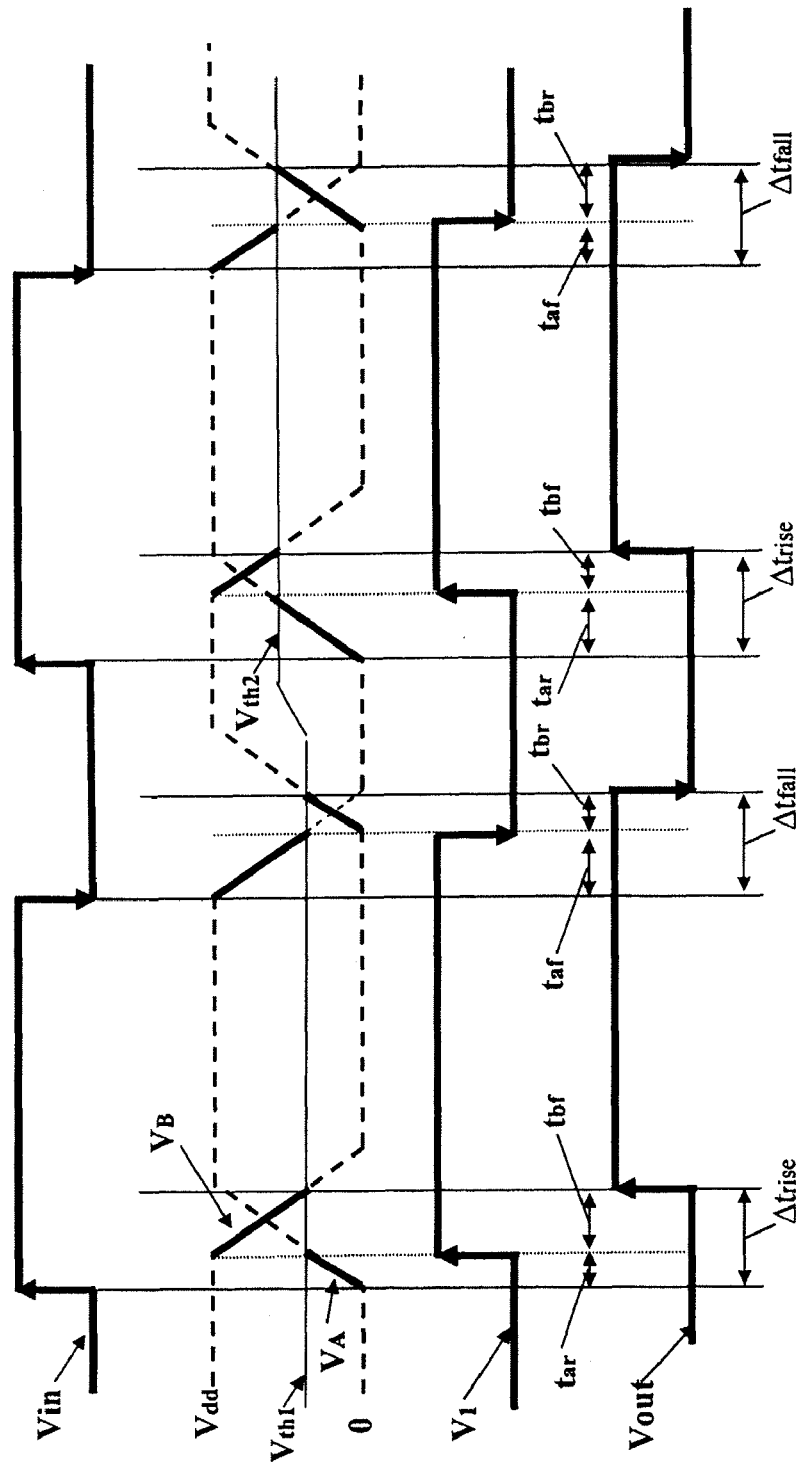
FIG. 4

DIGITAL DELAY CIRCUIT

FIELD OF THE INVENTION

The invention pertains to delay circuits, in general, and to a digital delay circuit, in particular.

BACKGROUND OF THE INVENTION

One problem with prior art digital delay circuits is that the time delay produced by the circuit will vary in dependence on the threshold voltage of the logic circuit coupled to the time determining capacitor.

It is therefore desirable to provide a digital time delay circuit in which the logic threshold voltage does not influence the time delay.

SUMMARY OF THE INVENTION

In accordance with the principles of the invention, a digital time delay circuit is provided in which fabrication process variations and temperature effects on the switching threshold level of digital circuits utilized in the, timing circuits are substantially eliminated.

In accordance with the principles of the invention, a digital delay circuit for delaying a digital signal by a predetermined time delay, comprises first and second identical delay circuits. The first delay circuit has an input coupled to a first node. The second delay circuit has an output coupled to an output node. The first delay circuit is connected in cascade to the second delay circuit via an intermediate node.

The first delay circuit comprises a first capacitor, first and second switched current sources each coupled to the first capacitor and each having a control input coupled to the input node, the first switched current source sources current to the first capacitor when a signal at the input node is at a first level and said the switched current source sinks current from the first capacitor when the signal is at a second level. The source current and the sink current are each of the same magnitude. A first digital circuit has an input coupled to the capacitor and is coupled to an intermediate node. The first digital circuit has a first input threshold voltage level, and provides an output at the intermediate node that is at one level when the capacitor voltage is below the threshold voltage level and provides an output at the intermediate node that is at a second level when the capacitor voltage is above the threshold voltage level.

The second delay circuit comprises a second capacitor, third and fourth switched current sources each coupled to the second capacitor and each having a control input coupled to the intermediate node, the third switched current source sourcing current to the second capacitor when a signal at the intermediate node is at a first level and the second switched current source sinking current from the second capacitor when the signal at the intermediate node is at a second level, the sourcing current and the sinking current each being of the same magnitude; a second digital circuit having an input coupled to the second capacitor and having an output coupled to the output node, the second digital circuit having a second input threshold voltage level equal to the first input threshold voltage level, the digital circuit providing an output at the output node that is at one level when the second capacitor voltage is below the threshold voltage level and providing an output at the output node that is at a second level when the second capacitor voltage is above the input threshold voltage level; whereby the digital delay circuit provides a time delay that is independent of the threshold voltage level.

BRIEF DESCRIPTION OF THE DRAWING

The invention will be better understood from a reading of the following detailed description of the drawing in which like reference designators are used to identify like elements in the various drawing figures, and in which:

FIG. 1 is a representation of a prior art digital delay circuit;

FIG. 2 illustrates waveforms in the prior art digital delay circuit of FIG. 1;

FIG. 3 is a diagram of a digital delay circuit in accordance with the principles of the invention; and FIG. 4 illustrates waveforms of the circuit of FIG. 3.

DETAILED DESCRIPTION

FIGS. 1 and 2 illustrate the problem to which the present invention is directed. Delay circuit 1 utilizes an electronic switch 101 that responds to an input signal to provide a time delay. Switch 101 controls the charge and discharge of a capacitor C from a current source I. As can be seen from FIG. 2, when switch 101 opens, the voltage across capacitor C, voltage Vc, increases in accordance with the relationship of $I/C=\Delta V/\Delta t$. As Vc increases from a first voltage level, zero volts, to a second voltage level, Vdd, it increases at a slope of $I/C$.

A digital circuit 103, represented by an inverter, is coupled to the capacitor C and is responsive to the capacitor voltage Vc. Digital circuit 103 has a threshold voltage Vth at which the output voltage of digital circuit 103 changes state.

Turning now to FIG. 2, the state of switch 101 is shown by curve 201, the voltage across capacitor C, Vc, is shown by curve 203, and the output voltage of digital circuit 103 is shown by curve 205.

When switch 101 is in a first or closed state, the output voltage Vo of digital circuit 103 is in a first or high state. When switch 101 changes state from its first or closed state to a second or open state, the voltage Vc begins to rise at a slope of $I/C$. The output voltage of digital circuit 103 initially remains in a first or high state. After a time delay $\Delta t$, voltage Vc reaches the switching threshold voltage Vth of the digital circuit 103 and the output voltage Vo of digital circuit 103 switches from its first or high state to its second or low output state.

The time delay $\Delta t$ is dependent on the switching threshold voltage by the equation $\Delta t = Vth \, (C/I)$. Unfortunately, the switching threshold voltage will vary with temperature and from device to device depending upon manufacturing process.

FIG. 3 shows an illustrative embodiment of a delay circuit 300 in accordance with the principles of the invention. Circuit 300 includes two identical delay stages 301, 303. Delay circuit 300 is provided on an integrated circuit 302 that may or may not include other circuitry.

Each delay stage 301, 303 includes input inverter 3011, 3021 and an output inverter 3013, 3023. Each inverter or digital circuit 3011, 3021, 3013, 3023 has the same input switching threshold voltage Vth and the input switching threshold voltages of the inverters or digital circuits 3011, 3021, 3013, 3023 all vary identically with temperature.

Input inverters 3011, 3021 are coupled to the control input of corresponding electronic switches 3015, 3025. Electronic switches 3015, 3025 function as single pole double throw type switches and are used to selectively couple either a current source 3017, 3027 or a current sink 3019, 3029 to respective capacitors Cl, C2. Current sources 3017, 3027 and current sinks 3019, 3029 each source or sink the same level of current I.

Turning now to FIG. 4, waveforms are shown for the input voltage Vin, capacitor voltage $V_A$, capacitor voltage $V_B$, voltage $V_1$, and output voltage Vout. The waveforms for capacitor voltage $V_A$ and capacitor voltage $V_B$ are superimposed on each other.

The time delay, Δtrise, between the rising edges of Vin and Vout as well as the time delay, Δtfall, between the falling edges of Vin and Vout are a function of the current I, the capacitance C of capacitors C1, C2 and the supply voltage Vdd which are all independent of the threshold voltage of the inverters 3011, 3021, 3013, 3023. More specifically Δtrise=Δtfall=Vdd(C/I). In addition, Δtrise is the sum of the time tar for the voltage $V_A$ to rise from zero to Vth plus the time tbf for the voltage $V_B$ to fall from Vdd to Vth; and Δtfall is the sum of the time taf for the voltage $V_A$ to fall from Vdd to Vth plus the time tbr for the voltage $V_B$ to rise from zero to Vth.

As the voltage Vth varies with temperature or because of process parameters, the effect of a variable Vth is eliminated by utilizing both rise and fall times from zero to Vth and from Vdd to Vth to determine the time delay.

The digital delay circuit 300 delays a digital signal by a predetermined time delay independent of the threshold voltage of the digital inverters or circuits utilized. Delay circuit 300 comprises an input node 3200; an output node 3300; a first delay circuit 301 coupled to the input node 3200; a second delay circuit 303 coupled in cascade to the first delay circuit 301 and coupled to the output node 3300, The first delay circuit 301 comprises a first capacitor Cl, first and second switched current sources 3017, 3019 each coupled to the first capacitor Cl and each having a control input coupled to the input node 3200. The first switched current source 3017 sourcing current to the first capacitor Cl when a signal at the input node 3200 is at a first level 0 volts. The second switched current source 3019 sinking current from the first capacitor Cl when the signal at node 3200 is at a second level. The sourcing current and the sinking current each being of the same magnitude I. The first digital circuit 3013 has an input coupled to capacitor C1 and an output at an intermediate node 3400. First digital circuit 3013 has a first input threshold voltage level Vth. First digital circuit 3013 provides an output at intermediate node 33400 that is at one level, zero, when the capacitor voltage $V_A$ is below the threshold voltage level Vth and provides an output at intermediate node 3400 that is at a second level Vdd when the capacitor has a voltage above the threshold voltage level. A second delay circuit 303 comprises a second capacitor C2, third and fourth switched current sources 3027, 3029 each coupled to the second capacitor C2 and each having a control input coupled to the intermediate node 3400. Third switched current source 3027 sources current to the second capacitor C2 when a signal at the intermediate node 3400 is at a first level and the fourth switched current source 3029 sinking current from the second capacitor C2 when the signal at the intermediate node 3400 is at a second level. The sourcing current and the sinking current are each of the same magnitude I.

A second digital circuit 3023 has an input coupled to the second capacitor C2 and has an output coupled to the output node 3300. Second digital circuit 3023 has an input threshold voltage level equal to the first input threshold voltage level Vth. Second digital circuit 3023 provides an output at the output node 3300 that is at one level when the second capacitor voltage $V_B$ is below the threshold voltage level Vth and provides an output at the output node 3300 that is at a second level when the second capacitor voltage $V_B$ is above the input threshold voltage level Vth. Digital delay circuit 300 provides a time delay that is independent of the threshold voltage level Vth of the digital circuits or inverters 3011, 3021, 3013, 3023.

The invention has been described in conjunction with a specific illustrative embodiment. It will be understood by those skilled in the art that various changes, substitutions and modifications may be made without departing from the spirit or scope of the invention. It is intended that all such changes, substitutions and modifications be included in the scope of the invention. It is not intended that the invention be limited to the illustrative embodiment shown and described herein. It is intended that the invention be limited only by the claims appended hereto, giving the claims the broadest possible scope and coverage permitted under the law.

What is claimed is:

1. A digital delay circuit for delaying a digital signal by a predetermined time delay, comprising:
    an input node to receive an input signal;
    an intermediate node;
    an output node to provide an output signal delayed from said input signal by a predetermined time delay;
    a first delay circuit coupled to said input node and said intermediate node;
    a second delay circuit coupled in cascade to said first delay circuit and coupled to said intermediate node and said output node;
    said first delay circuit comprising a first inverter having an input coupled to said input node, a first capacitor, first and second switched current sources each coupled to said first capacitor and each having a control input coupled to an output of said first inverter, said first switched current source sourcing current to said first capacitor when a signal at said input node is at a first level and said second switched current source sinking current from said first capacitor when said signal is at a second level, said sourcing current and said sinking current each being of a same, fixed magnitude, and a first digital circuit having an input coupled to said first capacitor, said first digital circuit having a first input threshold voltage level, said first digital circuit providing an output at said intermediate node that is at one level when a voltage across said first capacitor is below said threshold voltage level and providing an output at said intermediate node that is at a second level when a voltage across said first capacitor is above said threshold voltage level, wherein said first delay circuit operates to provide an intermediate delayed and inverted signal relative to the input signal at said intermediate node, said intermediate delayed and inverted signal delayed from said input signal by a first portion of said predetermined time delay, said first portion of said predetermined time delay being determined from the time for the voltage across said first capacitor to change states from one of said first or second voltage levels to said threshold voltage level;
    said second delay circuit comprising a second inverter having an input coupled to said intermediate node, a second capacitor, third and fourth switched current sources each coupled to said second capacitor and each having a control input coupled to an output of said second inverter, said third switched current source sourcing current to said second capacitor when a signal at said intermediate node is at a first level and said fourth switched current source sinking current from said second capacitor when said signal at said intermediate node is at a second level, said sourcing current and said sinking current each being of the same, fixed magnitude, and a second digital circuit having an input coupled to said second capacitor and having an output coupled to said output node, said second digital circuit having a second input threshold voltage level equal to said first input threshold voltage level, said second digital circuit providing an output at said output node that is at one level when a voltage across said second capacitor is below said threshold voltage level and providing an output at said output node that is at a second level when a voltage across said second capacitor is above said input threshold voltage level, wherein said second delay circuit operates to provide said output signal at said output node, said output signal delayed and inverted from said intermediate signal, said output signal delayed by a second portion of said predetermined time delay, said second portion of said predetermined time delay being determined from the time for the voltage across said second capacitor to change states from the other one of said first or second voltage levels to said threshold voltage level; said digital delay circuit being fabricated on a single integrated circuit; and wherein said first input threshold voltage level and said second input threshold voltage level vary identically with temperature;

wherein said first delay circuit is coupled to said second delay circuit at the intermediate node without a capacitor connected to the intermediate node; and wherein said digital delay circuit is configured to provide said predetermined time delay independent of variations of said threshold voltage level, said predetermined time delay comprising the summation of said first portion and said second portion.

2. The digital delay circuit of claim 1, further comprising an integrated circuit having said first and second digital circuits formed thereon.

3. The digital delay circuit of claim 2, wherein said threshold voltage level is temperature dependent.

4. The digital delay circuit of claim 2, wherein said threshold voltage level is fabrication process dependent.

5. The digital delay circuit of claim 4, wherein said threshold voltage level is temperature dependent.

6. The digital delay circuit of claim 1, wherein said first and second portions of said predetermined time delay are not equal.

7. A method for providing time delays in a digital circuit, said time delays being independent of temperature and fabrication process effects on digital circuit threshold levels, said method comprising:

providing a two stage delay circuit responsive to an input signal that switches between a first voltage level and a second voltage level to generate an output signal delayed from said input signal by a predetermined time delay, said two stage delay circuit being fabricated on a single integrated circuit;

connecting an output of a first stage of the two stage delay circuit to an input of a second stage of the two stage delay circuit at an intermediate node without a capacitor being connected to the intermediate node;

operating a first stage of said two stage delay circuit to provide an intermediate delayed and inverted signal delayed from said input signal by a first portion of said predetermined time delay, wherein operating the first stage comprises sinking and sourcing a fixed current from and to a first capacitor;

determining said first portion of said predetermined time delay from the time for a first timing voltage to change states from one of said first or second voltage levels to a first threshold voltage level;

operating a second stage of said two stage delay circuit to provide an output signal delayed and inverted from said intermediate delayed and inverted signal, the output being delayed from said intermediate signal by a second portion of said predetermined time delay, wherein operating the second stage comprises sinking and sourcing the fixed current from and to a second capacitor; and determining said second portion of said predetermined time delay from the time for a second timing voltage to change states from the other of said first or second voltage levels to a second threshold voltage level, wherein said first and second threshold voltage levels vary identically with temperature, wherein the summation of said first portion and said second portion is said predetermined time delay, and wherein said predetermined time delay is independent of said first and second threshold voltage levels.

8. The method of claim 7, further comprising:
using the first capacitor to provide said first timing voltage; and
using the second capacitor to provide said second timing voltage.

9. The method of claim 8, further comprising:
providing in said first stage a first digital circuit responsive to the voltage on said first capacitor and switchable at said first threshold voltage level; and
providing in said second stage a second digital circuit responsive to the voltage on said second capacitor and switchable at said second threshold voltage level.

10. A circuit comprising:
an input node configured to receive a digital signal to be delayed;
only two capacitance modules including a first capacitance module and a second capacitance module;
a first delay stage coupled to the input node to receive the signal, the first delay stage comprising:
a first inverter having an input coupled to the input node;
a first digital component with a first threshold voltage, wherein the first capacitance module is coupled to an input of the first digital component;
a first switched current source configured to selectively source a fixed current to the first capacitance module and having a control input coupled to an output of the first inverter; and
a second switched current source configured to selectively sink the fixed current from the first capacitance module and having a control input coupled to an output of the first inverter;
a second delay stage coupled to the first delay stage to receive the signal, the second delay stage comprising:
a second inverter having an input coupled to the first delay stage;
a second digital component with a second threshold voltage, wherein
the second capacitance module is coupled to an input of the second digital component;
a third switched current source configured to selectively source a fixed current to the second capacitance module and having a control input coupled to an output of the second inverter; and
a fourth switched current source configured to selectively sink the fixed current from the second capacitance module and having a control input coupled to an output of the second inverter; and
an output node coupled to the second delay stage to receive the signal with a time delay from when the signal was provided at the input node, wherein the time delay is independent of the first and second threshold voltages.

11. The circuit of claim 10, wherein the first threshold voltage is the same as the second threshold voltage.

12. The circuit of claim 10, wherein the time delay is proportional to the fixed current.

13. The circuit of claim 10, wherein said time delay comprises:
a first portion corresponding to a delay from the first delay stage; and
a second portion corresponding to a delay from the second delay stage.

14. The circuit of claim 13, wherein said first and second portions of said time delay are not equal.

15. A circuit comprising:
means for receiving a digital signal to be delayed at an input;
means for sending the signal through a first inverting delay stage comprising a first digital component with a first switching threshold voltage, wherein the means for sending through a first delay stage comprises:
a first capacitor coupled to the first digital component;
a first switched current source configured to selectively source a fixed current to the first capacitor; and
a second switched current source configured to selectively sink the fixed current from the first capacitor;
means for sending the signal through a second inverting delay stage comprising a second digital component with a second switching threshold voltage, wherein the means for sending through a second delay stage comprises:
a second capacitor coupled to the second digital component;
a third switched current source configured to selectively source the fixed current to the second capacitor; and
a fourth switched current source configured to selectively sink the fixed current from the second capacitor;
means for connecting the first inverting delay circuit to the second inverting delay circuit without connecting a capacitor between the first inverting delay circuit and the second inverting delay circuit; and
means for providing the signal at an output, the signal having a time delay from when the signal was provided at the input, wherein the time delay is independent of the first and second threshold voltages.

16. A circuit for delaying a digital signal by a first predetermined time delay, the circuit comprising:
a first inverter having an input node and an output node;
a first current source;
a first current sink;
a first switch having an input node and an output node, wherein the input node of the first switch is coupled to the output of the first inverter, and wherein the first switch is configured to selectively couple the first current source or the first current sink to the output node of the first switch;
a first capacitance module coupled to the output node of the first switch, wherein the first current source is configured to source a fixed current to the first capacitance module when coupled to the output node of the first switch, and wherein the first current sink is configured to sink the fixed current from the first capacitance module when coupled to the output node of the first switch;
a second inverter having an input node and an output node, wherein the input node of the second inverter is coupled to the output node of the first switch;
a third inverter having an input node and an output node, wherein the input node of the third inverter is coupled to the output node of the second inverter;
a second current source;
a second current sink;
a second switch having an input node and an output node, wherein the input node of the second switch is coupled to the output node of the third inverter, and wherein the second switch is configured to selectively couple the second current source or the second current sink to the output node of second switch;
a second capacitance module coupled to the output node of the second switch, wherein the second current source is configured to source the fixed current to the second capacitance module when coupled to the output node of the second switch, and wherein the second current sink is configured to sink the fixed current from the second capacitance module when coupled to the output node of the second switch; and
a fourth inverter having an input node and an output node, wherein the input node of the fourth inverter is coupled to the output node of the second switch;
wherein the first predetermined time delay is a sum of the charge or discharge time of only the first and second capacitance modules, wherein the first, second, third, and fourth inverters have a same input switching threshold voltage, and wherein the input switching threshold voltage of the first, second, third, and fourth inverters varies identically with temperature.

* * * * *